(12) United States Patent
Lee

(10) Patent No.: US 11,189,500 B2
(45) Date of Patent: Nov. 30, 2021

(54) METHOD OF MANUFACTURING A COMPONENT CARRIER WITH AN EMBEDDED CLUSTER AND THE COMPONENT CARRIER

(71) Applicant: AT&S (Chongqing) Company Limited, Chongqing (CN)

(72) Inventor: Minwoo Lee, Chongqing (CN)

(73) Assignee: AT&S (Chongqing) Company Limited, Chongqing (CN)

( * ) Notice: Subject to any disclaimer, the term of this patent is extended or adjusted under 35 U.S.C. 154(b) by 0 days.

(21) Appl. No.: 16/687,841

(22) Filed: Nov. 19, 2019

(65) Prior Publication Data

US 2020/0161274 A1    May 21, 2020

(30) Foreign Application Priority Data

Nov. 20, 2018    (CN) .......................... 201811386331.8

(51) Int. Cl.

| H01L 21/56 | (2006.01) |
| H01L 21/78 | (2006.01) |
| H01L 23/31 | (2006.01) |
| H01L 23/42 | (2006.01) |
| H01L 23/538 | (2006.01) |
| H01L 23/552 | (2006.01) |
| H01L 23/00 | (2006.01) |

(52) U.S. Cl.
CPC .......... *H01L 21/568* (2013.01); *H01L 21/561* (2013.01); *H01L 21/565* (2013.01); *H01L 21/78* (2013.01); *H01L 23/3121* (2013.01); *H01L 23/42* (2013.01); *H01L 23/5386* (2013.01); *H01L 23/552* (2013.01); *H01L 24/96* (2013.01); *H01L 2224/95001* (2013.01)

(58) Field of Classification Search
CPC ... H01L 21/561; H01L 21/565; H01L 21/568; H01L 21/78; H01L 23/3121; H01L 23/42; H01L 23/552; H01L 2224/95001; H01L 23/3135

See application file for complete search history.

(56) References Cited

U.S. PATENT DOCUMENTS

| 8,552,557 B1 | 10/2013 | Nangalia et al. |
| 10,340,249 B1 * | 7/2019 | Yu ........................... H01L 24/83 |
| 2005/0014309 A1 | 1/2005 | Hedler et al. |
| 2007/0039754 A1 * | 2/2007 | Salama ..................... H05K 1/09 |
| | | 174/262 |

(Continued)

FOREIGN PATENT DOCUMENTS

| CN | 1031873 A | 3/1989 |
| CN | 1031990 A | 3/1989 |

(Continued)

*Primary Examiner* — Feifei Yeung Lopez
(74) *Attorney, Agent, or Firm* — Robert A. Blaha; Smith Tempel Blaha LLC

(57) ABSTRACT

A method of manufacturing a component carrier includes: i) forming a stack having at least one electrically conductive layer structure and/or at least one electrically insulating layer structure, with at least one cavity formed in the stack, ii) forming a cluster by encapsulating a first electronic component and a second electronic component in a common encapsulant, and thereafter iii) placing the cluster in the common encapsulant at least partially into the cavity and v) embedding the cluster in the cavity.

13 Claims, 4 Drawing Sheets

(56) References Cited

U.S. PATENT DOCUMENTS

| | | | |
|---|---|---|---|
| 2008/0157330 A1* | 7/2008 | Kroehnert | H01L 25/0657 257/686 |
| 2009/0169219 A1 | 7/2009 | Nakano et al. | |
| 2012/0112336 A1 | 5/2012 | Guzek et al. | |
| 2012/0139120 A1 | 6/2012 | Chow et al. | |
| 2012/0171875 A1 | 7/2012 | Gan et al. | |
| 2012/0187568 A1 | 7/2012 | Lin et al. | |
| 2013/0015478 A1 | 1/2013 | Oh et al. | |
| 2013/0147054 A1 | 6/2013 | Lin et al. | |
| 2013/0168849 A1 | 7/2013 | Scanlan | |
| 2013/0168874 A1 | 7/2013 | Scanlan | |
| 2013/0244376 A1 | 9/2013 | Scanlan | |
| 2013/0249104 A1 | 9/2013 | Chi et al. | |
| 2013/0249106 A1 | 9/2013 | Lin et al. | |
| 2013/0295720 A1 | 11/2013 | Fuergut et al. | |
| 2014/0008809 A1 | 1/2014 | Scanlan | |
| 2014/0061944 A1 | 3/2014 | Lin et al. | |
| 2014/0077381 A1 | 3/2014 | Lin et al. | |
| 2014/0347834 A1* | 11/2014 | Lee | H05K 1/185 361/762 |
| 2015/0187710 A1 | 7/2015 | Scanlan et al. | |
| 2016/0043047 A1* | 2/2016 | Shim | H01L 21/56 257/773 |
| 2017/0011982 A1 | 1/2017 | Theuss et al. | |
| 2017/0148744 A1* | 5/2017 | Carson | H01L 21/561 |
| 2019/0067157 A1* | 2/2019 | Lin | H01L 23/42 |

FOREIGN PATENT DOCUMENTS

| | | |
|---|---|---|
| CN | 1033839 A | 7/1989 |
| CN | 1505126 A | 6/2004 |
| CN | 1825584 A | 8/2006 |
| CN | 101296566 A | 10/2008 |
| CN | 103187322 A | 7/2013 |
| CN | 103199075 A | 7/2013 |
| CN | 103383919 A | 11/2013 |
| CN | 106816416 A | 6/2017 |
| CN | 107006139 A | 8/2017 |
| CN | 107211527 A | 9/2017 |
| DE | 1020131 B | 11/1957 |
| DE | 102013104487 A1 | 11/2013 |
| JP | 2004186688 A | 7/2004 |
| JP | 2005195449 A | 7/2005 |
| KR | 20040048351 A | 6/2004 |
| SG | 116512 A1 | 11/2005 |
| SG | 11201404307T A | 10/2014 |
| SG | 11201404309V A | 10/2014 |
| TW | 200425300 A | 11/2004 |
| TW | 200425361 A | 11/2004 |
| WO | 2013101161 A1 | 7/2013 |
| WO | 2013102137 A2 | 7/2013 |

* cited by examiner

METHOD OF MANUFACTURING A COMPONENT CARRIER WITH AN EMBEDDED CLUSTER AND THE COMPONENT CARRIER

CROSS-REFERENCE TO RELATED APPLICATION

This application claims the benefit of the filing date of Chinese Patent Application No. 2018/11386331.8, filed Nov. 20, 2018, the disclosure of which is hereby incorporated herein by reference.

TECHNICAL FIELD

Embodiments of the invention generally relate to a method of manufacturing a component carrier, and to the component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

In particular, efficiently embedding an electronic component, in particular more than one electronic component, into a component carrier is a challenge.

SUMMARY

There may be a need to provide a method for efficiently embedding an electronic component, in particular more than one electronic component, into a component carrier.

A method of manufacturing a component carrier and the component carrier according to the independent claims are provided.

According to an exemplary embodiment of the invention, a method of manufacturing a component carrier is provided, wherein the method comprises: i) forming a stack comprising at least one electrically conductive layer structure and/or at least one electrically insulating layer structure, wherein at least one cavity is formed in the stack, ii) forming a cluster by encapsulating a first electronic component and a second electronic component in a common encapsulant, and, thereafter, iii) placing the cluster at least partially into the cavity and iv) embedding the cluster in the cavity.

According to another exemplary embodiment of the invention, a component carrier is provided. The component carrier comprising: i) a stack comprising at least one electrically conductive layer structure and/or at least one electrically insulating layer structure, wherein at least one cavity is formed in the stack, and ii) a cluster comprising a first electronic component and a second electronic component encapsulated in a common encapsulant. Hereby, the cluster is at least partially placed and embedded in the cavity.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board (PCB), an organic interposer, a substrate-like-PCB (SLP), and an IC (integrated circuit) substrate. A component carrier may also be a hybrid board combining different ones of the above-mentioned types of component carriers.

In the context of the present application, the term "cluster" may particularly denote a unit that comprises at least two electronic components which are encapsulated in a common encapsulant. The cluster may be manufactured by placing the electronic components, e.g. dies, on a common substrate such as a glass or metal carrier and then encapsulating the electronic components on the common substrate. Hereby, the electronic components may be glued to the common substrate in advance using an adhesive. In this manner, an encapsulated, in particular molded, cluster array may be manufactured and a plurality of cluster units may be obtained by dicing the cluster array. Hereby, the common substrate may be detached such that the cluster, in its most basic embodiment, may comprise two electronic components both encapsulated in a common encapsulant.

In the context of the present application, the term "cavity" may denote any opening in a layer stack which is suitable to at least partially accommodate a cluster unit as has been described above. For example, a layer stack may be provided with a plurality of electrically insulating and electrically conductive structures. The layer stack may for example be a copper clad laminate (CCL), wherein an electrically insulating core is sandwiched between two layers of electrically conductive copper material. The cavity in this layer stack/CCL may be manufactured for example using a laser. Especially, the metal layers may be removed by etching. In principle, every material removal method can be applied which enables the fabrication of a cavity in the layer stack, such that the cluster described above may be placed into it.

In the context of the present application, the term "common encapsulant" may denote any component or substance which is suitable for encapsulating at least two electronic components which are placed on a common substrate. The encapsulant may be a mold component such as an electrically insulating material (e.g. prepreg). The material of the encapsulant may be selected depending on the required properties.

According to an exemplary embodiment, the invention may be based on the idea that a component carrier with advantageous effects may be provided, when being fabricated such that the component carrier comprises a cluster which has been embedded in a cavity of a layer stack of the component carrier. The cluster is hereby a readily usable multi-functional unit, wherein at least two electronic components have already been encapsulated in a common encapsulant. While conventionally only one electronic component is been embedded into a component carrier, it has now been surprisingly found that two or more electronic components can be very efficiently embedded into a component carrier, when these electronic components are provided in the form of a readily usable and flexible cluster unit, wherein the electronic components are encapsulated into a common encapsulant in said cluster.

According to an exemplary embodiment, said component carrier may provide the following advantages. There are many known problems with embedding (more than one) electronic component into a component carrier, e.g.: i) a height mismatch between an electronic component (e.g. a die) and the height of the layer stack (e.g. the core of a CCL), which leads to an irregular resin filling (i.e. embedding), undulation on the electronic component area, and warpage, ii) a difference in the physical properties of the embedding material (e.g. resin) and the structure around the cavity, which puts a reliability risk on the embedded electronic component, iii) when heterogenous components (e.g. different heights) are embedded, problems arise with respect to depth control, when using e.g. a laser for drilling vias, iv) it is difficult to pre-check the quality of the embedding material for embedded electronic components, and v) during the embedding process of the electronic component in the component carrier, the electronic component may misalign. All of these issues may be overcome, when using the manufacturing method described above, i.e. when directly embedding the already finished cluster, wherein the electronic components are already encapsulated, into a cavity of the component carrier. In this manner, the shape, dimension, and quality of the cluster can already be controlled in a previous step, thereby avoiding many problems that would arise with respect to these properties in a later production stage. Furthermore, problems with undulation, warpage and dielectric layer thickness may be solved.

According to an exemplary embodiment, the cluster may be used as a patch inlay in conventional embedding schemes, especially when embedding heterogeneous components and/or composites. The described method may be compatible with existing processes, e.g. surface treatments and chemical processes, and may be implemented in a straight-forward manner into existing production lines.

In the following, further exemplary embodiments of the method and the component carrier will be explained.

In an embodiment, the first electronic component and the second electronic component are heterogeneous with respect to each other. This has the advantage that electronic components, which are very different in shape and dimension from each other, can be embedded in a component carrier in an efficient and robust manner. The electronic components may e.g. differ in their size, shape, or function. For example, one electronic component may be an active component, while the other electronic component may be a passive component. In another example, one electronic component may be a reconfigured and/or encapsulated electronic component, while the other electronic component may be a die.

In a further embodiment, the first electronic component and the second electronic component have a different height. This also may provide the advantage that electronic components of different dimensions may still be embedded in an efficient and robust manner. In this manner, problems that arise with respect to depth control, e.g. when using a laser for drilling vias, can be overcome.

In a further embodiment, a first main surface of the first electronic component and a second main surface of the second electronic component are aligned within the cluster at the same height thereby forming an aligned surface of the cluster. This may provide the advantage that the electronic components can be electrically contacted/coupled in a robust and reliable manner.

For example, during the manufacturing process, both electronic components may be placed onto a common substrate such that their respective lower main surfaces are on the same height, in other words flush with the surface of the common substrate. After an encapsulation step, the common substrate may be detached and then both lower main surfaces (i.e. the first and the second main surface) are on the same height. The electronic components may comprise electric contacts, e.g. pads or terminals, at said surface such that both electronic components could be electrically contacted at the same height within the component carrier. Thereby, forming electrical contacts, in particular when drilling and filling a hole to form a conductive through-hole connection, can be done in a reliable and robust manner.

In a further embodiment, placing further comprises i) placing the cluster into the cavity such that the aligned surface faces the upper main surface of the component carrier, or ii) placing the cluster into the cavity such that the aligned surface faces the lower main surface of the component carrier. This may provide the advantage that the component carrier can be manufactured in a flexible and efficient manner.

If the cluster is placed into the cavity such that the aligned surface, as it has been defined above, is closer to the lower main surface of the component carrier than to the upper main surface of the component carrier, then the aligned surface can be said to face the lower main surface of the component carrier. On the other hand, if the cluster is placed into the cavity such that the aligned surface is closer to the upper main surface of the component carrier than to the lower main surface of the component carrier, then the aligned surface can be said to face the upper main surface of the component carrier. In this manner, a flexible arrangement of the cluster in the component carrier is enabled, while at the same time an efficient matching of heights within the component carrier is achieved.

In a further embodiment, at a main surface of the cluster, a part of the first electronic component and/or a part of the second electronic component is exposed and not covered with the encapsulant. This may provide the advantage that the electronic components can be easily contacted electrically, e.g. by a via connection.

In a further embodiment, at least one of the electronic components, in particular both electronic components, comprises an electric contact, in particular a pad, at the main surface, wherein placing further includes i) placing the cluster into the cavity with the electric contact oriented face up or ii) placing the cluster into the cavity with the electric contact oriented face down. This may also provide the advantage that the component carrier can be manufactured in a flexible and efficient manner.

The electronic components may comprise electrical contacts such as a pad or a terminal at a surface such that one or both electronic components could be electrically contacted. For example, both electronic components may be electrically contacted at the same height level within the component carrier. Thereby, forming electrical contacts, in particular when drilling and filling a hole for forming a conductive through-hole connection, can be done in a reliable and robust manner.

In a further embodiment, the common encapsulant is a molding compound, and encapsulating further comprises molding the first electronic component and the second electronic component with the common molding compound. This may provide the advantage that an efficient encapsulation process is done, which can be directly implemented into existing production lines.

The molding component may for example be an electrically insulating material, e.g. a resin such as prepreg. The molding component may be provided in a liquid, soft, and/or uncured state in order to mold the shapes of the electronic components accurately. Afterwards, the molding component may be dried, hardened, and/or cured such that a readily usable cluster is obtained.

The molding material may for example be a thermoset resin and/or a special epoxy mold compound, comprising e.g. an inorganic and/or organic filler, a hardener, a release agent, a flame retardant, a stress modifier, a coloring agent, a coupling agent, or a catalyst. Furthermore, the molding material may comprise paste, ink, prepreg, powder, granular, or film type. The resin may comprise an engineered polymer such as epoxy, BT (bismaleimide-triazine), cyanide, PI (polyimide), PPO (polyphenylenoxide), resin blend, silicon modified compounds, and other polymers which may be used in electronics.

In a further embodiment, forming the cluster further comprises: i) providing and singularizing a wafer to obtain a plurality of electronic components, in particular reconfiguring a first die and a second die of the plurality of singularized dies to obtain the first electronic component and the second electronic component, ii) placing the first electronic component and the second electronic component on a common substrate, iii) encapsulating, in particular overmolding, the first electronic component and the second electronic component with the common encapsulant to obtain a cluster array, and iv) singularizing the cluster array in order to obtain the cluster. This may provide the advantage that the described method can be directly implemented into known and standardized production lines.

When a wafer is singularized, then a plurality of dies is obtained. In the most basic embodiment, the dies may be directly placed onto a common substrate and represent the electronic components. In another embodiment, a first die and a second die of the plurality of dies from the wafer are reconfigured to obtain the first electronic component and the second electronic component. These reconfigured electronic components may then be placed onto the common substrate. Alternatively, the first die and the second die may be placed onto the common substrate and are then reconfigured in order to obtain the first electronic component and the second electronic component.

The electronic components on the common substrate may all be encapsulated in one encapsulation step with one and the same common encapsulant. In this manner, a plurality of cluster units, i.e. a cluster array, is obtain on the common substrate. In a further step, said cluster array may be singularized/diced such that a plurality of cluster is provided, each of which can be embedded in the cavity of a component carrier.

In a further embodiment, the method further comprises laminating the stack with a further electrically insulating material on a first main surface of the stack and/or on a second main surface of the stack being opposite to the first main surface. This may provide the advantage that the component carrier can be build-up in a flexible manner and the cluster is further embedded in the layer stack. Laminating the stack with the further electrically insulating material may also be combined with the step of embedding. Electrically insulating material may be filled into the gaps between the stack and the cluster, thereby embedding the cluster. Further electrically insulating material may be added for forming the further electrically insulating layer above the cluster.

In a further embodiment, the method further comprises forming an interconnection path, in particular a via, through the electrically insulating layer structure in order to electrically contact the first electronic component and/or the second electronic component. This may provide the advantage that the component carrier can be designed in a flexible and robust manner.

A via (vertical interconnect access) is an electrical connection between layers in a physical electronic circuit that goes through the plane of one or more adjacent layers. The term via may include through-hole vias, buried vias, and blind vias. Microvias are used as interconnects between layers in high density interconnect (HDI) substrates and printed circuit boards (PCBs) to accommodate the high I/O density of advanced packages.

As described above, the electronic components may be electrically connected in a flexible and still robust manner, when via connections are formed within the component carrier. For example, the holes may be formed by laser drilling and may then be, at least partially, filled with electrically conductive material (e.g. by plating) such that efficient connections are enabled. Also, redistribution structures may be formed in this manner. Using the cluster, a common plane may be set for the interconnect via termination. In this manner, known problems with the via depth (especially in the case of heterogeneous components) can be overcome.

In a further embodiment, the component carrier is configured as a system-in-board. This may provide the advantage that the component carrier is provided in a flexible and cost-efficient manner. The term "system-in-board" may particularly denote a very complex kind of component carrier which comprises a large amount of surface mounted and/or embedded components (e.g. integrated circuit, light-emission diode) which function together and/or rely on each other in order to perform a complex systematic function or fulfill a specific complex task that could not be performed by one of the components alone.

In a further embodiment, the cluster comprises a cluster redistribution structure encapsulated in the encapsulant. This may provide the advantage that the electronic components of the cluster can be electrically connected in a flexible and efficient manner.

A redistribution structure may be realized as described in the following. The electronic components in the cluster may comprise several electric contacts, e.g. pads, which may be connected, e.g. by interconnect vias, to electric contacts of the component carrier layer stack. For example, the electronic components may be glued using an adhesive with their main surface, where they respectively comprise a pad, to a common substrate. When the common substrate is removed, the aligned surface (where the pads are localized) of the cluster may be laminated with further layers, e.g. an electrically insulating layer followed by an electrically conductive layer. Then, holes may be drilled through the layers in order to form interconnections to the pads of the electronic components. These holes may be at least partially filled with electrically conductive material, such that interconnection vias through the electrically insulating layer and the electrically conductive layer to the pads of the encapsulated components are formed. In this manner, a readily usable cluster may be provided, which comprises a redistribution structure.

In a further embodiment, the stack comprises a component carrier redistribution structure, and said redistribution structure is electrically connected to at least one of the first electronic component and the second electronic component of the cluster. This may provide the advantage that the electronic components can be electrically contacted in an efficient and reliable manner.

A redistribution layer (RDL) may be an additional layer comprising an electrically conductive material (e.g. a metal layer) on an electronic component or a component carrier that makes I/O (input/output) pads of an integrated circuit available to other locations. When an integrated circuit is manufactured, it usually has a set of I/O pads that are electrically connected (e.g. wire-bonded) to the pins of a package. A redistribution layer may be a layer of wiring on the chip that enables a simpler chip-to-chip, chip-to-component carrier, or component carrier-to-component carrier bonding. In an embodiment, the terminals at the component carrier side of the redistribution layer are smaller than the terminals at the component carrier opposed side of the redistribution layer. For example, the redistribution layer may comprise solder balls and/or copper pillars at the side, which is facing away from the embedded component, in order to be connectable to another entity. In an exemplary embodiment, the electric contacts of the electronic components of the embedded cluster may be small in size and a component carrier redistribution structure is arranged below the cluster (still within the component carrier). The redistribution structure may hereby be designed such that the small electric contacts of the cluster are redistributed into terminals of a larger size.

In a further embodiment, a material of the encapsulant is functionalized to provide at least one additional function, in particular at least one of the group consisting of shielding of electromagnetic radiation, heat removal, mechanical reinforcement, and a flexible or semiflexible property. This may provide the advantage that embedding the cluster provides additional functionalities in a flexible and cost-efficient manner.

In this manner, the adhesion between component and filling resin may be enhanced. The cluster shape may be rectangular, circular, or diagonally shaped to maximize space or special purposes. The cluster shape may thereby enhance functions of the encapsulant material such as heat spread, mechanical reinforcement, or flexibility.

In a further embodiment, the electronic component is selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a die, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the at least one electrically insulating layer structure comprises at least one of the group consisting of resin (such as reinforced or non-reinforced resins, for instance epoxy resin or Bismaleimide-Triazine resin, cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based Build-Up Film for substrates for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may consist of at least a layer of glass, Silicon (Si) or a photo-imagable or dry-etchable organic material like epoxy-based Build-Up films or polymer compounds like Polyimide, Polybenzoxazole, or Benzocyclobutene.

In an embodiment, the at least one electrically conductive layer structure and/or the electrically conductive structure comprises at least one of the group consisting of copper, aluminum, nickel, silver, gold, palladium, cobalt, and tungsten. Although copper is usually preferred, other materials or coated versions thereof are possible as well.

DETAILED DESCRIPTION OF ILLUSTRATED EMBODIMENTS

Figure 1A:
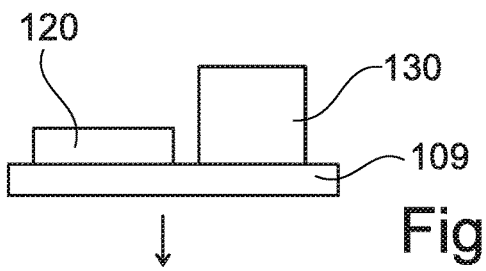
FIGS. 1A, 1B, 1C, 1D and 1E illustrate an exemplary embodiment of a method of manufacturing a component carrier according to the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a molded component cluster is prepared by applying overmold (encapsulant) on a carrier substrate on which electronic components are reconfigured. The molded component cluster is placed in a cavity of a panel core (e.g. a component carrier core). A dielectric layer is formed with film material lamination, e.g. by a printing method. Multiple RDLs (retribution layer) and functional patterning can be formed by laser vias, lithography, and other PCB process technologies.

According to an exemplary embodiment of the invention, the following process steps are performed: i) die singularization (of wafer), ii) component/die reconfiguration on a common carrier (e.g. metal, glass, CCL) substrate, iii) over-molding (encapsulating) the components on the substrate, iv) dicing/laser cutting of the molded component cluster, v) cluster embedding in a panel core (e.g. the core of the layer stack of a component carrier), vi) dielectric material (e.g. epoxy-based build up material (such as ABF (Ajinomoto build-up film)), PID (photo-imageable dielectric), prepreg) lamination or printing on the top side of the component carrier, vii) tape detachment from the component carrier, viii) dielectric material (e.g. epoxy-based build up material, PID, prepreg) lamination or printing on bottom side of the component carrier, ix) interconnection path preparation with laser drilling or lithography, x) metallization (e.g. plating, sputtering), and xi) build up & circuitization.

According to an exemplary embodiment of the invention, the following process steps are performed with respect to the cluster: i) providing a primer coated foil (around 5 μm thickness), ii) laser drilling of fiducials in the fil and forming overlay, iii) printing of an adhesive on the foil, iv) vacuum treatment of the adhesive, v) component supply and assembly of components on the adhesive, vi) curing of the adhesive, vii) laying up and pressing prepreg layer(s) over the component(s), viii) detachment of the carrier substrate (e.g. glass or metal) and curing. There may be two ways of how to proceed further. The first option is i) etching of copper (both sides or one side; if one side only then treatment with an oxide can be performed), and then ii) cutting of cluster units. The second option is i) copper etching for SAP or half etching for MSAP processes, ii) attaching a primer resin layer at the aligned surface of the cluster, iii) laser and RDL patterning above the resin layer, and iv) detaching the common substrate/carrier and etching or anti-tarnishing on copper (SR or oxide).

FIGS. 1A to 1E illustrate an exemplary embodiment of a method of manufacturing a component carrier 100.

FIG. 1A: a first electronic component 120 and a second electronic component 130 on a common substrate 109 (such as a metal, glass, or CCL carrier) are provided. The electronic components 120, 130 can be assembled onto an adhesive (not shown) of the common substrate 109. The common substrate 109 can function as a warpage balance. Hereby, the first electronic component 120 and the second electronic component 130 are heterogeneous with respect to each other, in particular the first electronic component 120 and the second electronic component 130 have a different height.

Figure 1B:
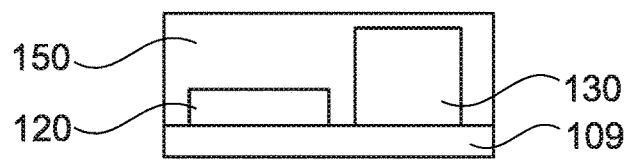

FIG. 1B: the first electronic component 120 and the second electronic component 130 are encapsulated, in particular molded, in a common encapsulant 150, in particular a common mold. The common mold can for example be an electrically insulating material such as prepreg.

Figure 1C:
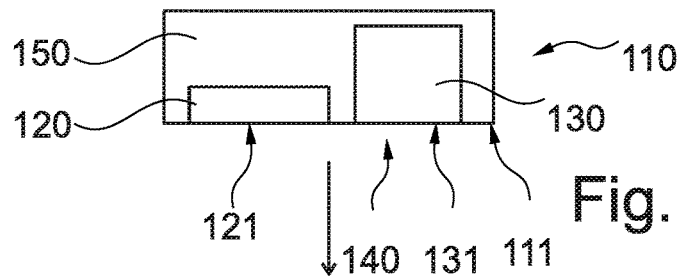

FIG. 1C: the common substrate 109 is removed (detached) and the cluster 110 is thereby provided. Hereby, a first main surface 121 of the first electronic component 120 and a second main surface 131 of the second electronic component 130 are aligned within the cluster 110 at the same height, thereby forming an aligned surface 140 on the cluster 110.

Figure 1D:
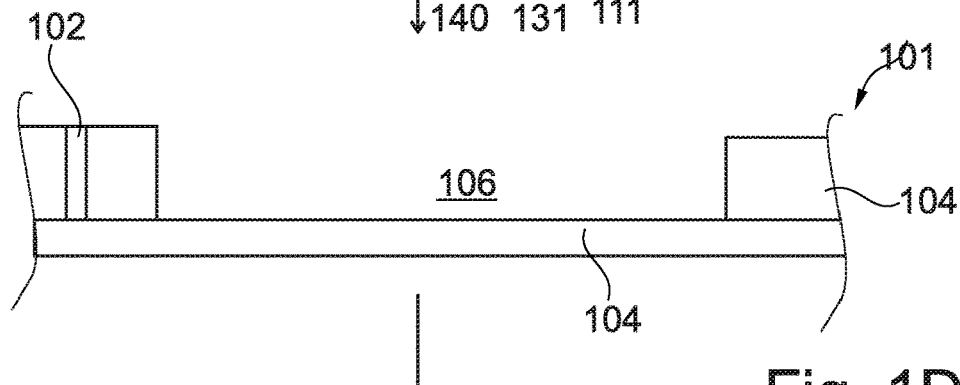

FIG. 1D: a (layer) stack 101 is formed comprising at least one electrically conductive layer structure 102 and/or at least one electrically insulating layer structure 104, wherein a cavity 106 is formed in the stack 101.

Figure 1E:
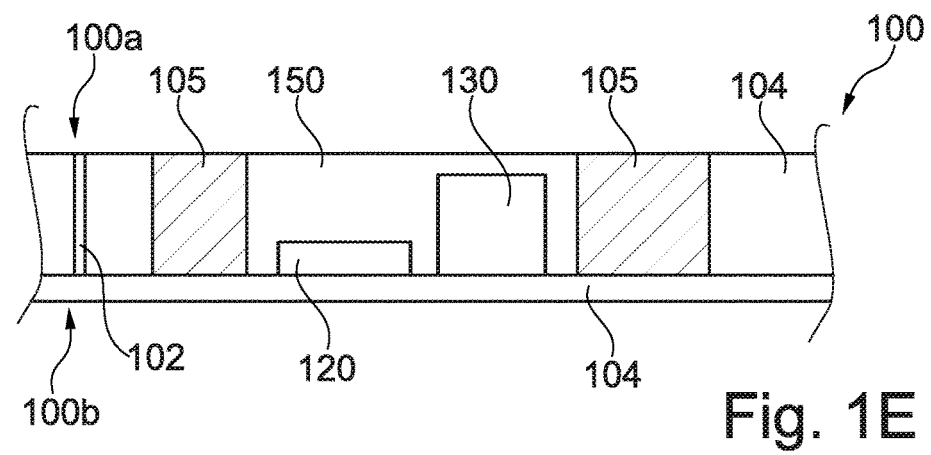

FIG. 1E: after performing the steps described above, the cluster 110 is placed into the cavity 106 of the (layer) stack 101 and the cluster 110 is then embedded with an embedding material 105, for example with an electrically insulating material, in the cavity 106. In the example shown, the cluster 110 is placed into the cavity 106 such that the aligned surface 140 faces the lower main surface 100b of the component carrier 100 being opposite to the upper main surface 100a. Optionally, the surface of the cluster 110 can also be covered with the embedding material 105 (not shown in the example).

FIGS. 2A to 2D illustrate an exemplary embodiment of a method of manufacturing the cluster 110.

Figures 2A, 2B, 2C, 2D:
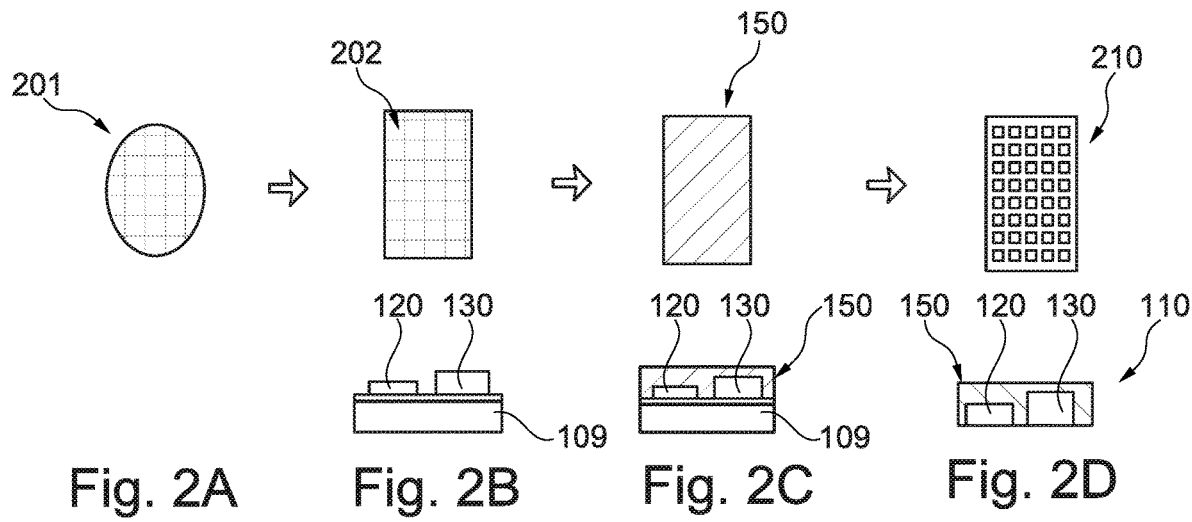
FIGS. 2A, 2B, 2C and 2D illustrate an exemplary embodiment of a method of manufacturing the cluster according to the invention.

FIG. 2A: a wafer 201 is provided and singularized such that a plurality of dies 202 is obtained.

FIG. 2B: a first die and a second die of the plurality of dies 202 is reconfigured to obtain the first electronic component 120 and the second electronic component 130. The dies 202 are therefore placed onto the common substrate 109, e.g. a metal or glass carrier. Alternatively, the dies are reconfigured in the first place and the reconfigured electronic components 120, 130 are then placed onto the common substrate 109. The top view shows an array of dies 202 or electronic components 120, 130, respectively. The side view below the top view shows the first electronic component 120 and the second electronic component 130 on the common substrate 109.

FIG. 2C: the electronic components 120, 130 are then encapsulated, in particular over-molded with a common encapsulant 150. In the top view merely the encapsulant 150 can be seen, while in the side view below the top view, it can be seen that the first electronic component 120 and the second electronic component 130 are encapsulated with the common encapsulant 150 such that a cluster array 210 is obtained.

FIG. 2D: The cluster array 210 is singularized, e.g. by dicing or laser cutting, into a plurality of clusters 110. The common substrate 109 is then removed. The top view shows the singularization of the cluster array 210 and the side view below the top view shows a single cluster 110 element.

Figure 3A:
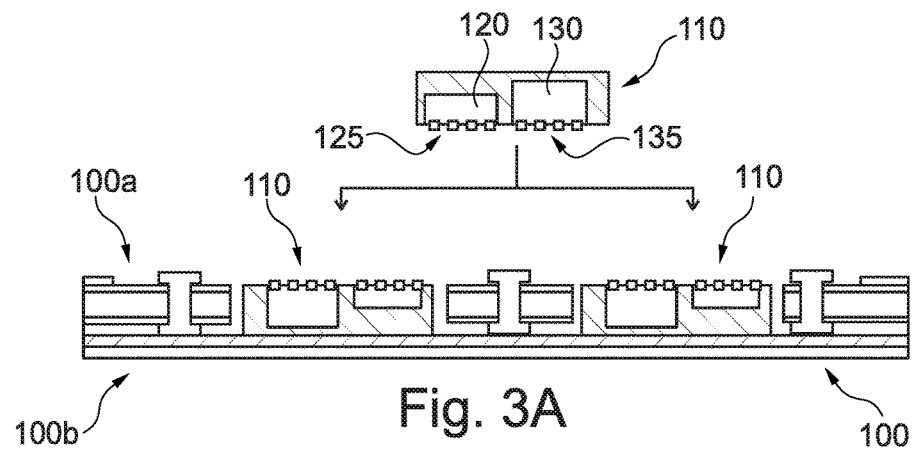
FIGS. 3A and 3B illustrate an exemplary embodiment of two options when manufacturing a component carrier according to the invention.
Figure 3B:
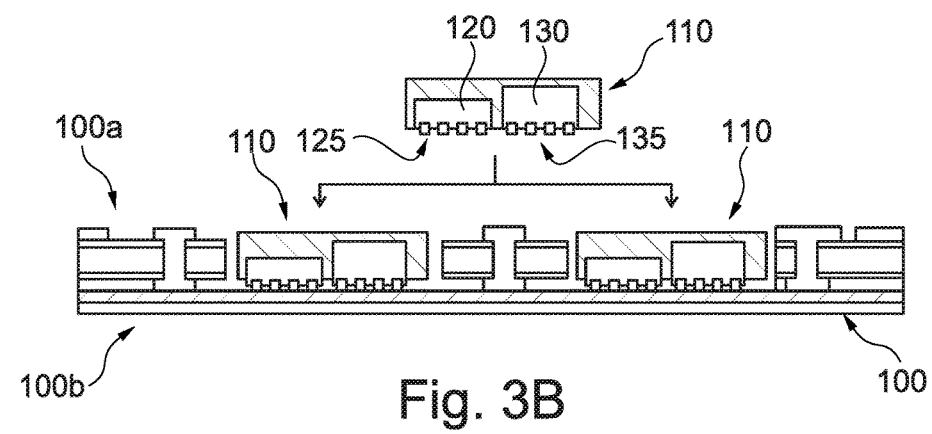

FIGS. 3A and 3B illustrate an exemplary embodiment of two options when manufacturing a component carrier 100.

The first electronic component 120 comprises a first pad 125 at the main surface 121 and the second electronic component 130 comprises a second pad 135 at the main surface 131. Hereby, at a main surface 111 of the cluster 110, a part of the first electronic component 120 and a part of the second electronic component 130 is exposed and not covered with the encapsulant 150.

FIG. 3A: the cluster 110 is placed into the cavity 106 with the pads 125, 135 oriented face up. In this arrangement, the aligned surface 140 of the cluster 110 faces the upper main surface 100a of the component carrier 100.

FIG. 3B: the cluster 110 is placed into the cavity 106 with the pads 125, 135 oriented face down. In this arrangement, the aligned surface 140 of the cluster 110 faces the lower main surface 100b of the component carrier 100.

FIGS. 4A to 4D illustrate an exemplary embodiment of a method of manufacturing a component carrier 100. The component carrier from FIG. 3b is taken as a starting point in FIG. 4A. However, the component carrier from FIG. 3A can be used in the same manner.

Figure 4A:
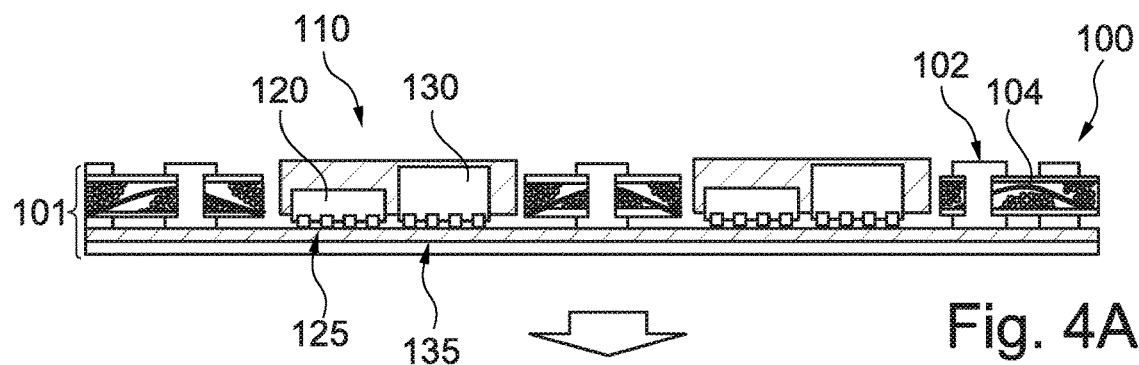
FIGS. 4A, 4B, 4C and 4D illustrate an exemplary embodiment of a method of manufacturing a component carrier according to the invention.
Figure 4B:
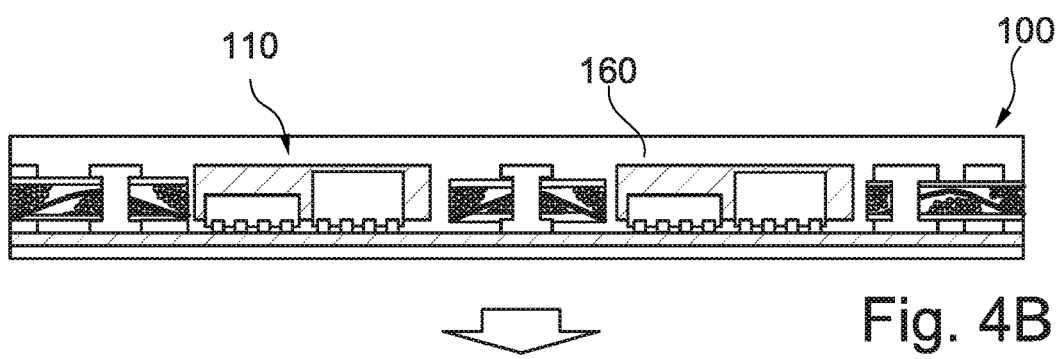

FIG. 4B: the stack 101 is laminated with a further electrically insulating material 160 on the upper main surface of the stack 101.

Figure 4C:
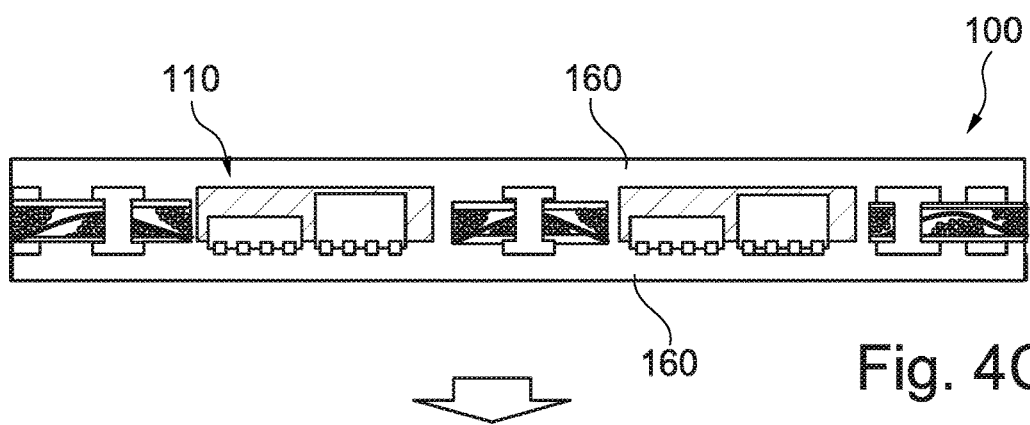

FIG. 4C: the stack 101 is laminated with a further electrically insulating material 160 on the lower main surface of the stack 101 being opposite to the upper main surface. Beforehand, electrically insulating and/or electrically conductive layers of the stack 101 located below the cluster have been removed, e.g. tape detachment.

Figure 4D:
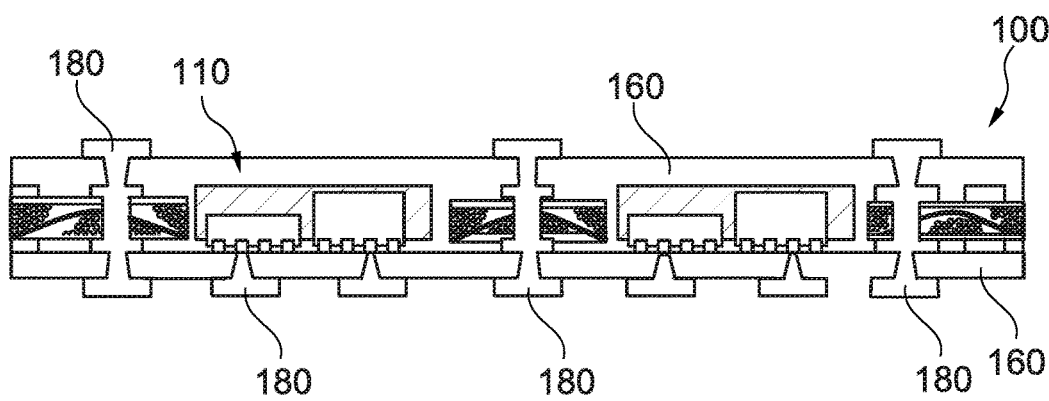

FIG. 4D: interconnection paths 180, i.e. vias, are formed with laser drilling or lithography processes through the further electrically insulating layer structures 160 in order to electrically contact the first electronic component 120 and the second electronic component 130 of the embedded cluster 110. Pads and/or terminals at the main surfaces 100a, 100b of the component carrier 100 are thereby electrically coupled with electronic contacts (e.g. pads) 125, 135 of the electronic components. The pads and/or terminals are formed by metallization (e.g. plating, sputtering) followed and/or accompanied with known build-up and circuitization processes.

FIGS. 5A to 5D illustrate an exemplary embodiment of a method of manufacturing the cluster 110 with a redistribution structure 510.

Figure 5A:
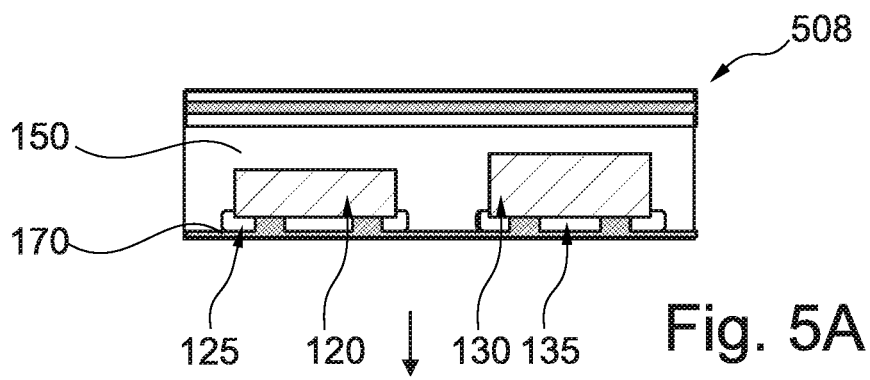
FIGS. 5A, 5B, 5C and 5D illustrate an exemplary embodiment of a method of manufacturing the cluster with a redistribution structure according to the invention.

FIG. 5A: the cluster 110 is provided with the electronic components 120, 130 encapsulated in a common encapsulant 150. The main surfaces 121, 131 of the electronic components 120, 130 with the electronic contacts had been glued with an adhesive 170 to the common substrate 109, which has already been removed at this stage. An additional carrier structure 508 has been attached to the cluster 110 as a warpage balance.

Figure 5B:
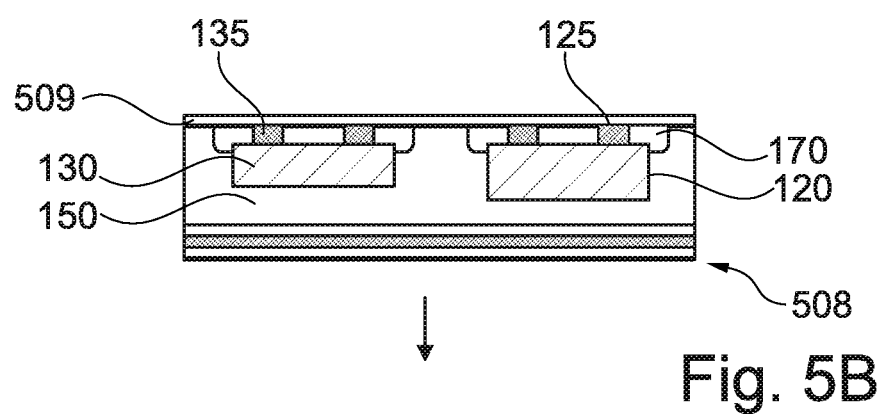

FIG. 5B: the cluster 100 is turned upside-down and a primer resin layer 509 is attached to the upper main surface of the cluster 110, where the pads 125, 135 of the electronic components 120, 130 are exposed.

Figure 5C:
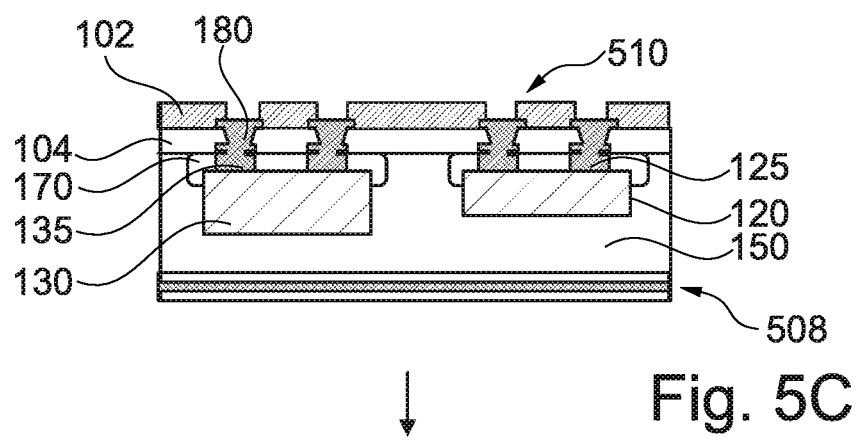

FIG. 5C: additional layer structures are attached to the cluster 110 and holes are drilled through these layer structures using a laser. The holes can be at least partially filled with electrically conductive material for obtaining via connections. Thereby, the electric contacts of the electronic components 120, 130 can be electrically contacted.

Figure 5D:
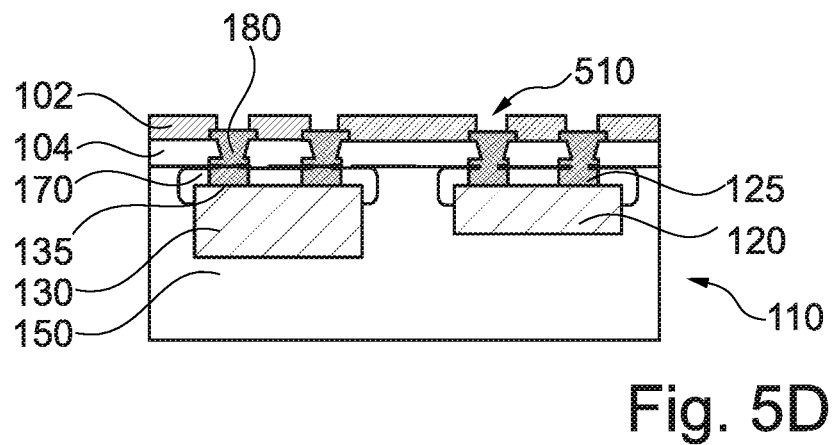

FIG. 5D: the additional carrier structure 508 is detached and a cluster 110 with a redistribution structure 510 is provided.

Implementation of the invention is not limited to the preferred embodiments shown in the figures and described above. Instead, a multiplicity of variants are possible which use the solutions shown and the principle according to the invention even in the case of fundamentally different embodiments.

It should be noted that the term "comprising" does not exclude other elements or steps and the use of the article "a" or "an" does not exclude a plurality. Also, elements described in association with different embodiments may be combined.

REFERENCE SIGNS

100 Component carrier
100a Upper main surface

100b Lower main surface
101 Stack
102 Electrically conductive structure
104 Electrically insulating layer structure
105 Embedding material
106 Cavity
109 Common substrate
110 Cluster
111 Main surface of cluster
120 First electronic component
121 First main surface
125 First pad
130 Second electronic component
131 Second main surface
135 Second pad
140 Aligned surface
150 Encapsulant/molding compound
160 Further electrically insulating layer structure
170 Adhesive
180 Via
201 Wafer
202 Die
210 Cluster array
508 Additional carrier structure
509 Primer resin layer
510 Redistribution structure

The invention claimed is:

1. A method of manufacturing a component carrier, the method comprising:
   forming a stack comprising at least one electrically conductive layer structure and at least one electrically insulating layer structure, wherein at least one cavity is formed in the at least one electrically insulating layer structure,
   wherein the at least one electrically insulating layer structure comprises at least one of the group consisting of reinforced resin, non-reinforced resin, epoxy resin, Bismaleimide-Triazine resin, cyanate ester, polyphenylene derivate, glass, prepreg material, FR-4, FR-5, polyimide, polyamide, liquid crystal polymer, epoxy-based Build-Up Film, polytetrafluoroethylene;
   forming a cluster by encapsulating a first electronic component and a second electronic component in a common encapsulant,
   wherein forming the cluster further comprises:
   providing and singularizing a wafer to obtain a plurality of electronic components;
   placing the first electronic component and the second electronic component on a common substrate;
   encapsulating the first electronic component and the second electronic component with the common encapsulant to obtain a cluster array; and
   singularizing the cluster array to obtain the cluster; thereafter placing the cluster at least partially into the cavity; and
   embedding the cluster in the cavity using an electrically insulating embedding material.

2. The method according to claim 1,
   wherein the first electronic component and the second electronic component are heterogeneous with respect to each other.

3. The method according to claim 2,
   wherein the first electronic component and the second electronic component have a different height.

4. The method according to claim 1,
   wherein a first main surface of the first electronic component and a second main surface of the second electronic component are aligned within the cluster at the same height thereby forming an aligned surface of the cluster.

5. The method according to claim 4, wherein placing the cluster at least partially into the cavity further comprises:
   placing the cluster into the cavity such that the aligned surface faces the upper main surface of the component carrier; or
   placing the cluster into the cavity such that the aligned surface faces the lower main surface of the component carrier.

6. The method according to claim 1,
   wherein, at a main surface of the cluster, a part of the first electronic component and/or a part of the second electronic component is exposed and not covered with the common encapsulant.

7. The method according to claim 1,
   wherein at least one of the first and second electronic components comprises an electric contact at a main surface, and wherein placing the cluster at least partially into the cavity includes
   placing the cluster into the cavity with the electric contact oriented face up or placing the cluster into the cavity with the electric contact oriented face down.

8. The method according to claim 1,
   wherein the common encapsulant is a molding compound, and wherein encapsulating further comprises:
   molding the first electronic component and the second electronic component with the common molding compound.

9. The method according to claim 1, wherein forming the cluster further comprises:
   reconfiguring a first die and a second die of a plurality of singularized dies on the common substrate to obtain the first electronic component and the second electronic component.

10. The method according to claim 1, further comprising:
    laminating the stack with a further electrically insulating material on a first main surface of the stack and/or on a second main surface of the stack being opposite to the first main surface.

11. The method according to claim 1, further comprising:
    forming an interconnection path at least partially through the electrically insulating layer structure to electrically contact the first electronic component and/or the second electronic component.

12. The method according to claim 1,
    wherein the component carrier is configured as one of a printed circuit board, an organic interposer, a substrate-like-PCB, an IC substrate.

13. A method of manufacturing a component carrier, the method comprising:
    forming a stack comprising at least one electrically conductive layer structure and at least one electrically insulating layer structure, wherein at least one cavity is formed in the at least one electrically insulating layer structure,
    wherein the at least one electrically insulating layer structure comprises at least one of the group consisting of reinforced resin, non-reinforced resin, epoxy resin, Bismaleimide-Triazine resin, cyanate ester, polyphenylene derivate, glass, prepreg material, FR-4, FR-5, polyimide, polyamide, liquid crystal polymer, epoxy-based Build-Up Film, polytetrafluoroethylene;
    forming a cluster by encapsulating a first electronic component and a second electronic component in a common encapsulant, thereafter placing the cluster at least partially into the cavity; and
embedding the cluster in the cavity using an electrically insulating embedding material;
wherein the first electronic component and the second electronic component are heterogeneous with respect to each other; and
wherein the first electronic component and the second electronic component are arranged in a horizontal direction with respect to each other.

* * * * *